(12) United States Patent
Yu

(10) Patent No.: US 6,313,505 B2
(45) Date of Patent: *Nov. 6, 2001

(54) METHOD FOR FORMING SHALLOW SOURCE/DRAIN EXTENSION FOR MOS TRANSISTOR

(75) Inventor: Bin Yu, Fremont, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/145,785

(22) Filed: Sep. 2, 1998

(51) Int. Cl.$^7$ .................................................. H01L 27/088
(52) U.S. Cl. .......................... 257/336; 257/344; 257/401; 257/408; 257/900; 438/301; 438/304; 438/306; 438/491
(58) Field of Search ..................... 257/408, 336, 257/344, 900, 401; 438/491, 301, 304, 306

(56) References Cited

U.S. PATENT DOCUMENTS

| | | | |
|---|---|---|---|
| 5,012,306 | * 4/1991 | Tasch, Jr. et al. ................. | 357/23.4 |
| 5,559,357 | * 9/1996 | Krivokapic ........................... | 257/336 |
| 5,780,896 | * 7/1998 | Ouo ...................................... | 257/344 |
| 5,998,835 | * 12/1999 | Furukawa et al. .................... | 257/330 |
| 6,025,635 | * 2/2000 | Krivokapic ........................... | 257/412 |
| 6,049,107 | * 4/2000 | Peidous ................................ | 257/336 |

\* cited by examiner

*Primary Examiner*—William Mintel
(74) *Attorney, Agent, or Firm*—LaRiviere, Grubman & Payne, LLP

(57) ABSTRACT

A method for making a ULSI MOSFET chip includes forming the gate of a transistor on a silicon substrate, covering the gate with a SiON protective layer, and then implanting a pre-amorphization high dose Si or Ge implant into the substrate. Next, dopant is pre-implanted into the substrate to promote subsequent formation of source and drain extensions, with the SiON layer protecting the gate from the pre-amorphization high dose Si or Ge and from the dopant. Undoped polysilicon and polygermanium is then deposited onto the substrate adjacent the gate at relatively low temperatures (600° C.) to establish elevated source and drain regions without excessively thermally stressing the chip. The SiON layer is removed from the gate, and the gate and elevated source and drain regions are implanted with dopant, followed by rapid thermal annealing to form the source and drain extensions in the substrate below the gate. The gate and elevated source and drain regions are then silicidized.

2 Claims, 3 Drawing Sheets

METHOD FOR FORMING SHALLOW SOURCE/DRAIN EXTENSION FOR MOS TRANSISTOR

TECHNICAL FIELD

The present invention relates generally to semiconductor fabrication, and more particularly to methods for fabricating improved ultra-large scale integration (ULSI) semiconductor devices such as ULSI metal oxide silicon field effect transistors (MOSFETs).

BACKGROUND OF THE INVENTION

Semiconductor chips or wafers are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate on a silicon substrate, and then forming a source region and a drain region side by side in the substrate beneath the gate by implanting appropriate dopant materials into the areas of the substrate that are to become the source and drain regions. The gate is insulated from the source and drain regions by a thin gate oxide layer, with small portions of the source and drain regions, referred to as "extensions", directly underlying the gate. This generally-described structure cooperates to function as a transistor.

As the dimensions of MOSFETs desirably are reduced as discussed above, it will be readily appreciated that the depth to which the source and drain extensions of a transistor penetrates the silicon substrate decreases. Unfortunately, very shallow source/drain extensions are characterized by relatively high series resistances measured laterally across the extensions (i.e., measured in a dimension that is orthogonal to the depth of the extension in the substrate), which is a major cause of drive current degradation in ULSI transistors. Moreover, the shallow extensions increase the difficulty of forming otherwise desirable silicide in the source and drain regions.

To address the above-noted problem, elevated source and drain regions that are formed next to the gate on top of the substrate have been proposed. The elevated source and drain structures, however, have heretofore been formed by epitaxy, which is a high temperature process for depositing pure silicon on the substrate to establish the elevated source and drain regions. Indeed, epitaxy typically requires a deposition temperature of in excess of 1100° C. As recognized herein, the use of such a high temperature degrades the profiles of dopant implants and, hence, degrades transistor performance. Further, epitaxy is an expensive process to undertake. The present invention recognizes and addresses one or more of the above-noted problems.

BRIEF SUMMARY OF THE INVENTION

A method is disclosed for establishing at least one transistor on a semiconductor device. The method includes forming a gate on a semiconductor substrate, and depositing at least one protective layer on the gate. At least one dopant substance is pre-implanted into the substrate, with the protective layer substantially preventing implanting of the dopant substance through the layer into the gate. As intended by the present invention, the pre-implanting of the dopant substance promotes subsequent formation of source and drain extensions. Then, elevated source and drain regions are formed on the substrate adjacent the gate, and at least the elevated source and drain regions are implanted with at least one dopant substance to establish the transistor.

In a preferred embodiment, at least one sidewall spacer is established on the gate prior to the pre-implanting step, and at least one amorphization substance is implanted into the substrate prior to the pre-implanting step. The protective layer substantially prevents implanting the amorphization substance through the layer into the gate. Preferably, the protective layer is then removed from the gate prior to implanting the elevated source and drain regions with dopant, such that at least one dopant substance is implanted into the gate when the elevated source and drain regions are implanted with dopant.

As disclosed in detail below, the method can further include rapidly thermally annealing at least the elevated source and drain regions after implanting the elevated source and drain regions with dopant. This establishes source and drain extension regions in the substrate, which is promoted by the pre-implanting of dopant and amorphization substance. The gate and the elevated source and drain regions are then silicidized.

To minimize the temperature to which the device is subjected during fabrication, the elevated source and drain regions are formed by depositing one or more of polysilicon and polygermanium on the substrate. With this structure, the polysilicon/polygermanium is deposited at a temperature of no more than one thousand degrees Celsius (1000° C.), and indeed can be deposited at a temperature of about six hundred degrees Celsius (600° C.). A semiconductor device made according to the present method, and a digital processing apparatus incorporating the device, are also disclosed.

In another aspect, a method for making an ultra-large scale integration (ULSI) semiconductor device includes forming at least one gate on at least one semiconductor substrate, and forming elevated source and drain regions above the substrate by depositing at least one poly-semiconductor substance on the substrate.

In still another aspect, a semiconductor device includes at least one transistor. In turn, the transistor includes a gate disposed on a silicon substrate and elevated source and drain regions on the substrate next to the gate. In accordance with the present invention, the source and drain regions include at least polysilicon and/or polygermanium.

Other features of the present invention are disclosed or apparent in the section entitled "DETAILED DESCRIPTION OF THE INVENTION".

DETAILED DESCRIPTION OF THE INVENTION

Figure 1:
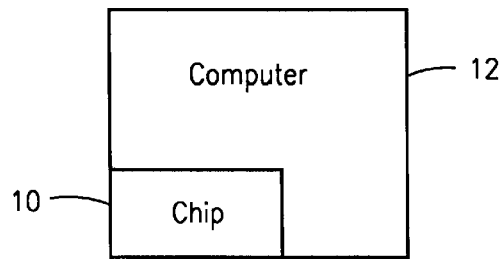
FIG. 1 is a schematic diagram of a semiconductor device made according to the present invention, shown in combination with a digital processing apparatus.

Referring initially to FIG. 1, a semiconductor device embodied as a chip 10 is shown incorporated into a digital processing apparatus such as a computer 12. The chip 10 is made in accordance with the below disclosure.

Figure 2:
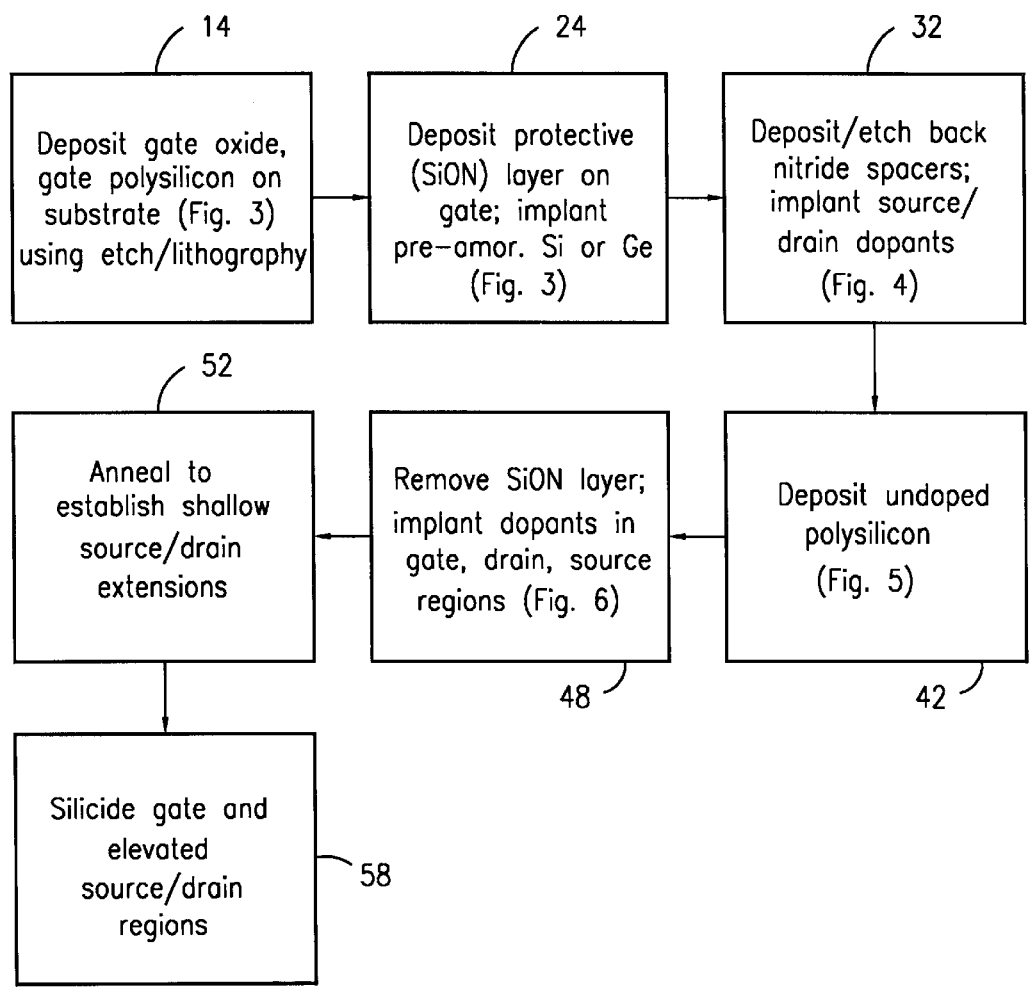
FIG. 2 is a flow chart showing the steps of the present invention.
Figure 3:
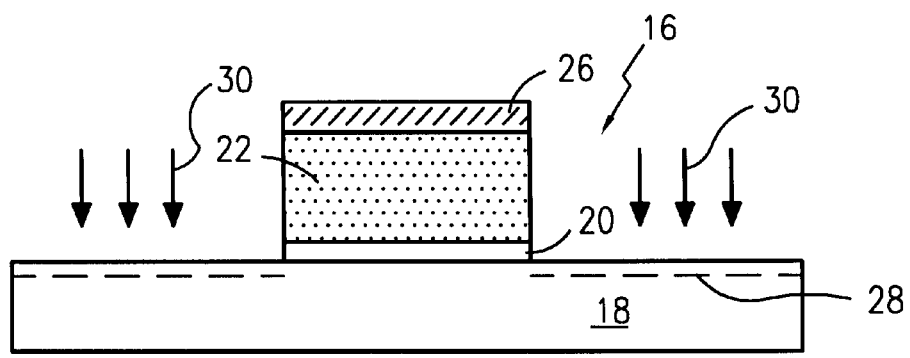
FIG. 3 is a side view of the device after the gate polysilicon and gate oxide has been formed, during preamorphization implanting.

Now referring to FIGS. 2 and 3, as indicated at block 14 in FIG. 2 and as shown in FIG. 3, using conventional semiconductor fabrication techniques including low pressure chemical vapor deposition (LPCVD) and appropriate etching and lithography, a transistor gate, generally designated 16, is formed on a silicon or other semiconductor substrate 18. As shown, the gate 16 includes a thin insulating gate oxide layer 20 that faces the substrate 18 and a gate polysilicon stack 22 on the gate oxide layer 20.

Additionally, as indicated at block 24 in FIG. 2 and as shown in FIG. 3, a protective silicon-oxygen-nitrogen (SiON) layer 26 is deposited on the top of the gate 16. Then, an amorphization substance such as high-dose silicon (Si) or germanium (Ge), represented by the dashed line 28, is implanted into the substrate 18 as indicated by the arrows 30. As intended by the present invention, the implantation of the amorphization substance promotes formation of source and drain extensions under the gate 16 during subsequent steps disclosed below. Those skilled in the art will recognize that the protective layer 26 substantially prevents implanting the amorphization substance through the layer 26 into the gate 16.

Figure 4:
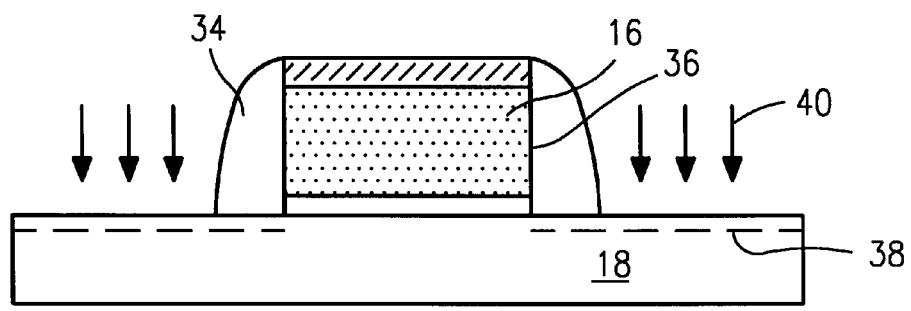
FIG. 4 is a side view of the device after the nitride spacers have been formed, during source and drain extension region dopant implantation.

Proceeding to block 32 and now referring to FIG. 4, nitride sidewall spacers 34 are deposited on the substrate 18 and etched in accordance with wellknown principles to establish the shoulder configuration around the sides 36 of the gate 16 as shown in FIG. 4. Next, appropriate dopant substances are preimplanted into the substrate 18 as represented by the dashed line 38 and as indicated by the arrows 40. The dopant substances could be, e.g., boron fluoride ($BF_2$), arsenic, boron, or phosphorous. As understood by the present invention, the preimplanting of dopant promotes subsequent formation of source and drain extensions during subsequent processes described below. The protective SiON layer 26 substantially prevents implanting the dopant substance through the layer 26 into the gate 16.

Figure 5:
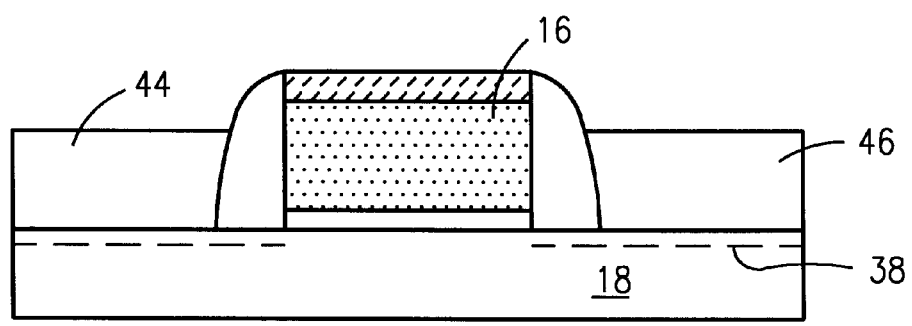
FIG. 5 is a side view of the device after deposition of the undoped polysilicon adjacent the gate.

Following the above-described steps, the process moves to block 42 of FIG. 2, wherein one or more undoped polysemiconductor substances such as polysilicon and polygermanium, and preferably both, are deposited onto the substrate 18 next to the gate 16 at a temperature of less than one thousand degrees Celsius (1000° C.) and preferably at a temperature of about six hundred degrees Celsius (600° C.) to establish elevated source and drain regions 44, 46, as shown in FIG. 5. The source and drain regions 44, 46 are elevated in the sense that they are disposed above the substrate 18, looking down on FIG. 5. Per the present invention, the polysemiconductor substance is selective as it is deposited, in that it does not deposit on the field oxide of the chip 10 nor does it deposit on the SiON protective layer 26. It is to be understood that the positions of the source and drain regions 44, 46 relative to the gate 16 can be reversed from those shown, depending on the type of transistor desired.

Figure 6:
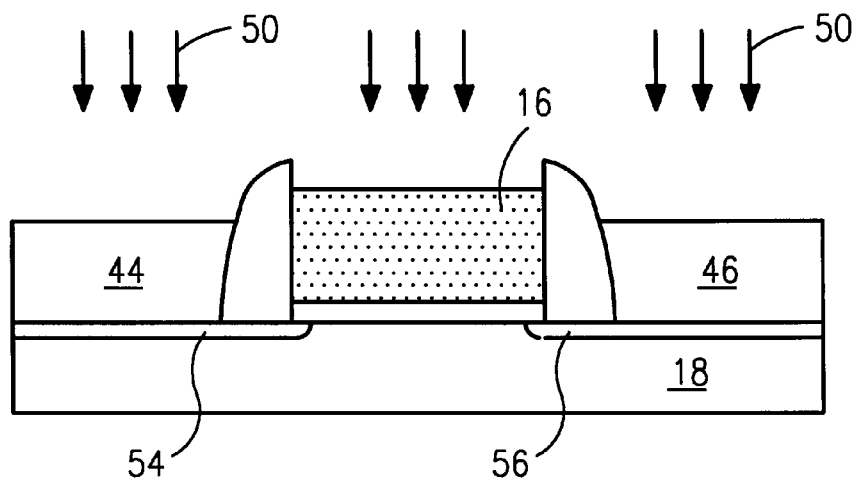
FIG. 6 is a side view of the device after the protective SiON layer has been removed, the source and drain regions have been implanted with dopant, and the device has undergone rapid thermal annealing to form the source and drain extension regions.

Moving to block 48 in FIG. 2 and now considering FIG. 6, the SiON protective layer 26 is next removed from the gate 16 by, e.g., wet etching. After removal of the protective layer 26, appropriate dopants are implanted into the elevated source and drain regions 44, 46 and into the gate 16, as indicated by the arrows 50.

Proceeding to block 52 of FIG. 2, the structure is next subjected to rapid thermal annealing (RTA) using RTA principles known in the art to establish source and drain extension regions 54, 56 in the substrate 18. More specifically, under the influence of RTA, the dopant that had been pre-implanted in the substrate 18 at block 32 in FIG. 2 diffuses laterally in the substrate 18 to establish at least portions of the extension regions 54, 56 directly under the gate 16. This diffusion is promoted by the amorphous substance or substances that were implanted in the substrate 18 at block 24 of FIG. 2.

Figure 7:
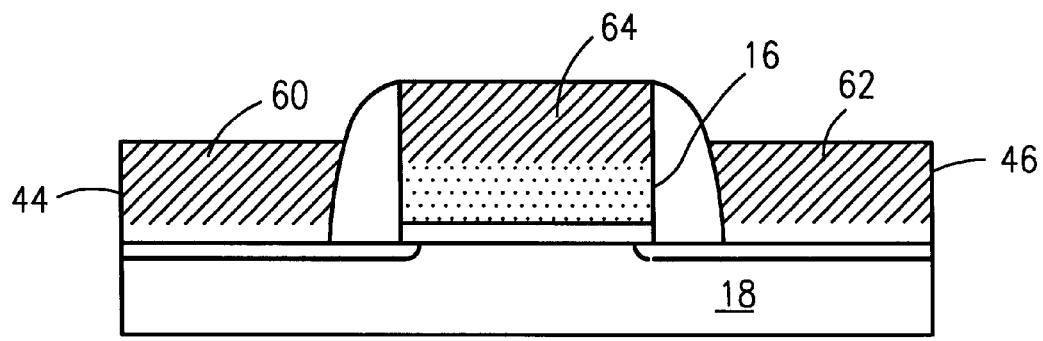
FIG. 7 is a side view of the device after silicidation.

Completing the present description, at block 58 portions 60, 62, respectively, of the elevated source and drain regions 44, 46, and portion 64 of the gate 16, are silicidized, as indicated by cross-hatch lines in FIG. 7. In one preferred embodiment, the silicidation is undertaken by sputtering a refractory material such as titanium or cobalt onto the portions 60, 62, 64.

While the particular METHOD FOR FORMING SHALLOW SOURCE/DRAIN EXTENSION FOR MOS TRANSISTOR as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Indeed, although a single transistor structure is shown in the drawings for clarity, the skilled artisan will appreciate that the chip 10 can include plural transistors, each substantially identical to that shown, as well as other circuit components. All structural and functional equivalents to the elements of the abovedescribed preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A semiconductor device including at least one transistor including a gate disposed on a silicon substrate and elevated source and drain regions on the substrate next to the gate, the source and drain regions including at least polysilicon and/or polygermanium, wherein the source and drain regions and the gate are silicidized, the gate having a single non-silicidized region and a single silicidized region.

2. The device of claim 1, further comprising a digital processing apparatus.

* * * * *